United States Patent
Ho et al.

(10) Patent No.: US 11,022,885 B2
(45) Date of Patent: Jun. 1, 2021

(54) PHOTOSENSITIVE MIDDLE LAYER

(71) Applicant: Taiwan Semiconductor Manufacturing Co., Ltd., Hsin-Chu (TW)

(72) Inventors: Chun-Chih Ho, Taichung (TW); Kuan-Hsin Lo, Nantou County (TW); Ching-Yu Chang, Yilang County (TW); Chin-Hsiang Lin, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 194 days.

(21) Appl. No.: 16/119,880

(22) Filed: Aug. 31, 2018

(65) Prior Publication Data

US 2020/0073243 A1    Mar. 5, 2020

(51) Int. Cl.
*G03F 7/004* (2006.01)
*G03F 7/038* (2006.01)
(Continued)

(52) U.S. Cl.
CPC .............. *G03F 7/11* (2013.01); *G03F 7/0045* (2013.01); *G03F 7/038* (2013.01); *G03F 7/039* (2013.01); *G03F 7/0757* (2013.01); *G03F 7/162* (2013.01); *G03F 7/168* (2013.01); *G03F 7/2002* (2013.01); *G03F 7/2004* (2013.01); *G03F 7/322* (2013.01)

(58) Field of Classification Search
CPC ........ G03F 7/0045; G03F 7/038; G03F 7/039; G03F 7/0757; G03F 7/091; G03F 7/095; G03F 7/11; G03F 7/162; G03F 7/168; G03F 7/2002; G03F 7/2006; G03F 7/322
See application file for complete search history.

(56) References Cited

U.S. PATENT DOCUMENTS 8,796,666 B1  8/2014  Huang et al.
9,093,530 B2  7/2015  Huang et al.
(Continued)

FOREIGN PATENT DOCUMENTS

TW     20182833 A    8/2018

OTHER PUBLICATIONS

Masamitsu Shirai and Masahiro Tsunooka, "Photoacid and Photobase Generators: Chemistry and Applications to Polymeric Materials," Prog. Polym. Sci., vol. 21, pp. 1-45, 1996.

*Primary Examiner* — Brittany L Raymond
(74) *Attorney, Agent, or Firm* — Haynes and Boone, LLP (57) ABSTRACT

A method includes providing a substrate; forming a bottom layer over the substrate; forming a middle layer over the bottom layer, a top surface of which including a photosensitive moiety having a first end anchored in the middle layer and a second end extending away from the top surface of the middle layer; forming a photoresist layer over the middle layer; exposing the photoresist layer to a radiation source; and developing the photoresist layer to form a pattern. The photosensitive moiety, which includes one of a photo-acid generator (PAG), a photo-base generator (PBG), photo-decomposable base (PDB), or photo-decomposable quencher (PDQ), may be anchored to a polymer backbone forming the middle layer via one or more linker groups. A distance by which the photosensitive moiety extends into the photoresist layer may be determined by a length of the linker group.

20 Claims, 5 Drawing Sheets (51) Int. Cl.
*G03F 7/039* (2006.01)
*G03F 7/075* (2006.01)
*G03F 7/11* (2006.01)
*G03F 7/16* (2006.01)
*G03F 7/20* (2006.01)
*G03F 7/32* (2006.01)

(56) References Cited

U.S. PATENT DOCUMENTS

| | | |
|---|---|---|
| 9,213,234 B2 | 12/2015 | Chang |
| 9,223,220 B2 | 12/2015 | Chang |
| 9,256,133 B2 | 2/2016 | Chang |
| 9,536,759 B2 | 1/2017 | Yang et al. |
| 9,548,303 B2 | 1/2017 | Lee et al. |
| 9,645,499 B2 | 5/2017 | Hu |
| 9,704,711 B2 * | 7/2017 | Liu .................... H01L 21/0271 |
| 9,857,684 B2 | 1/2018 | Lin et al. |
| 9,859,206 B2 | 1/2018 | Yu et al. |
| 9,875,892 B2 | 1/2018 | Chang et al. |
| 2006/0035167 A1 * | 2/2006 | Angelopoulos ....... C08F 220/14 430/270.1 |
| 2016/0284537 A1 | 9/2016 | Liu et al. |

* cited by examiner

PHOTOSENSITIVE MIDDLE LAYER

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of IC evolution, functional density (i.e., the number of interconnected devices per chip area) has generally increased while geometry size (i.e., the smallest component that can be created using a fabrication process) has decreased. As sizes of lithographic features are reduced, higher numerical aperture processes are needed to overcome the resolution limit.

Lithographic tri-layer structures having a photosensitive top layer formed over a middle layer and a bottom layer have been implemented to address challenges associated with photolithography patterning processes. While tri-layer structures have been generally adequate for improving the patterning processes, they have not been entirely satisfactory. For example, non-uniform light absorption through a thickness of the photosensitive top layer may lead to undesirable pattern profile following a development process. Thus, improvements in controlling pattern profile using tri-layer structures are desired.

BRIEF DESCRIPTION OF THE DRAWINGS

Aspects of the present disclosure are best understood from the following detailed description when read in association with the accompanying figures. It is noted that, in accordance with the standard practice in the industry, various features in the drawings are not drawn to scale. In fact, the dimensions of illustrated features may be arbitrarily increased or decreased for clarity of discussion.

DETAILED DESCRIPTION

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features. Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure relates generally to IC device manufacturing and, more particularly, to device patterning processes using a lithographic tri-layer structure. The tri-layer structure includes a photosensitive top layer (e.g., a photoresist), a middle layer (e.g., a hard mask layer), and a bottom layer (e.g., bottom anti-reflective coating, or BARC) formed on a substrate. Using tri-layer structures in photolithography has demonstrated advantages in minimizing substrate reflectivity of a radiation (e.g., light) source and improving etching selectivity between various underlying layers. However, improvements in the tri-layer structure for advanced patterning processes are still desired. For example, it has been observed that a top portion of the photoresist layer generally absorbs more light than a bottom portion of the photoresist layer, leading to non-uniform photochemical changes (e.g., changes in resist material's solubility and/or polarity) within the photoresist layer during an exposure process. As a result, irregularity such as footing (i.e., pattern line width is wider in the bottom portion than in the top portion) or undercut (i.e., pattern line width is narrower in the bottom portion than in the top portion) may be present in the final pattern and may adversely affect subsequent processing steps. As demonstrated by embodiments below, incorporating photo-responsive compositions (PRCs) immobilized onto a top surface of the middle layer provides additional sites of photochemical reactions within the photoresist layer, thus preserving the proper profile (e.g., uniform line widths) of the final pattern.

Figure 1:
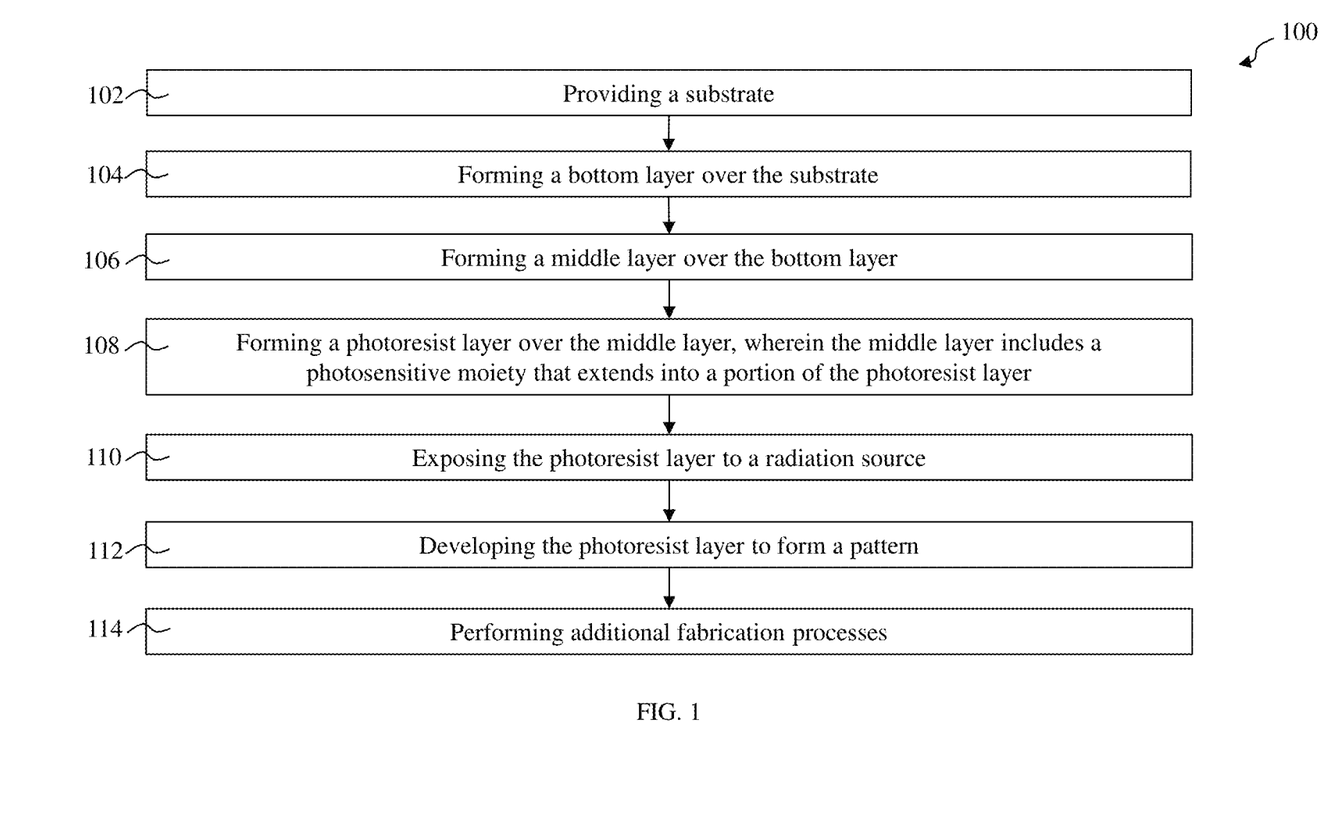
FIG. 1 is a flowchart of a method for fabricating an example semiconductor device according to various aspects of the present disclosure.
Figure 9:
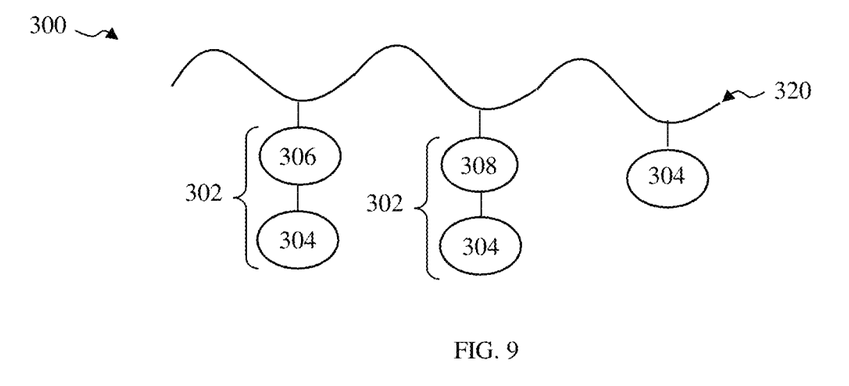
FIGS. 9, 10A, 10B, 10C, and 11 illustrate example chemical structures according to various aspects of the present disclosure.
Figure 10A:
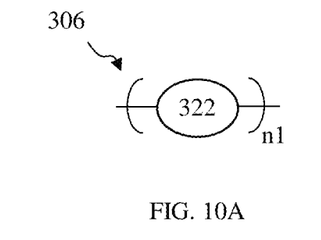
Figure 10B:
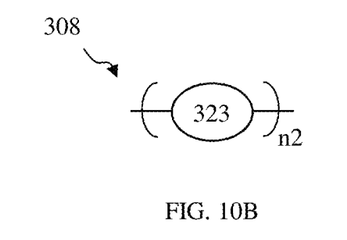
Figure 10C:
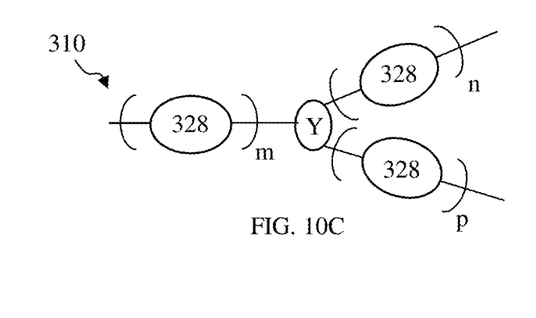
Figure 11:
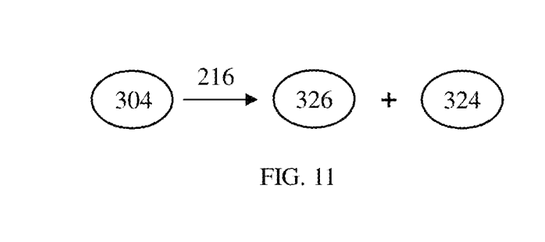

FIG. 1 illustrates a flowchart of a method 100 for processing a workpiece 200 according to some aspects of the present disclosure. The method 100 is merely an example, and is not intended to limit the present disclosure beyond what is explicitly recited in the claims. Additional operations can be provided before, during, and after the method 100, and some operations described can be replaced, eliminated, or moved around for additional embodiments of the process. Intermediate steps of the method 100 are described with reference to fragmentary cross-sectional side views of the workpiece 200 as shown in FIGS. 2-8B and 12A-13B, while schematic representations of example chemical structures are shown in FIGS. 9-11. For clarity and ease of explanation, some elements of the figures have been simplified.

Figure 2:
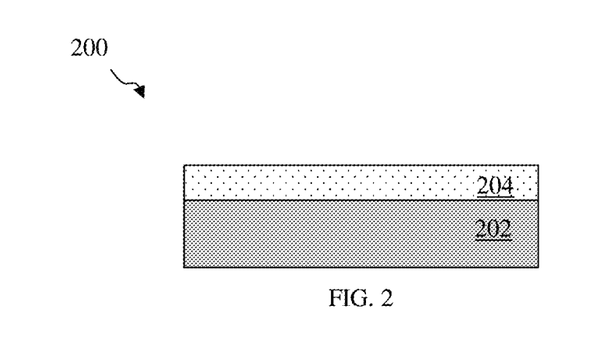
FIGS. 2, 3, 4, 5, 6, 7, 8A, and 8B are fragmentary cross-sectional side views of an example semiconductor device at different steps of the method of FIG. 1 according to various aspects of the present disclosure.

Referring to FIGS. 1 and 2, the method 100 provides (or is provided with) a substrate 202 at operation 102. The substrate 202 may comprise an elementary (single element) semiconductor, such as silicon in a crystalline structure and/or germanium in a crystalline structure; a compound semiconductor, such as silicon carbide, gallium arsenic, gallium phosphide, indium phosphide, indium arsenide, and/or indium antimonide; an alloy semiconductor such as SiGe, GaAsP, AlInAs, AlGaAs, GaInAs, GaInP, and/or GaInAsP; a non-semiconductor material, such as soda-lime glass, fused silica, fused quartz, and/or calcium fluoride ($CaF_2$); and/or combinations thereof.

The substrate 202 may be a single-layer material having a uniform composition. Alternatively, the substrate 202 may include multiple material layers having similar or different compositions suitable for IC device manufacturing. In one example, the substrate 202 may be a silicon-on-insulator (SOI) substrate having a semiconductor silicon layer formed on a silicon oxide layer. In another example, the substrate 202 may include a conductive layer, a semiconductor layer, a dielectric layer, other layers, and/or combinations thereof.

The substrate 202 may include various circuit features formed thereon or therein including, for example, field effect transistors (FETs), metal-oxide semiconductor field effect transistors (MOSFETs), CMOS transistors, high voltage transistors, high frequency transistors, bipolar junction transistors, diodes, resistors, capacitors, inductors, varactors, other suitable devices, and/or combinations thereof.

In some embodiments where the substrate 202 includes FETs, various doped regions, such as source/drain regions, are formed in or on the substrate 202. The doped regions may be doped with p-type dopants, such as phosphorus or arsenic, and/or n-type dopants, such as boron or $BF_2$, depending on design requirements. The doped regions may be planar or non-planar (e.g., in a fin-like FET device) and may be formed directly on the substrate 202, in a p-well structure, in an n-well structure, in a dual-well structure, or using a raised structure. Doped regions may be formed by implantation of dopant atoms, in-situ doped epitaxial growth, and/or other suitable techniques.

Still referring to FIGS. 1 and 2, the method 100 forms a bottom layer 204 (or a first layer) over the substrate 202 at operation 104. In many embodiments, the bottom layer 204 is a bottom anti-reflective coating (BARC) whose composition is chosen in order to minimize reflectivity of a radiation source implemented during exposure of a subsequently-formed photoresist layer (e.g., photoresist layer 208 in FIG. 4). The bottom layer 204 may be formed by spin-coating a BARC material (e.g., an amorphous carbon material) onto a top surface of the substrate 202 (or a top surface of the topmost material layer of a multi-layer substrate) and optionally baked to cure the BARC.

Figure 3:
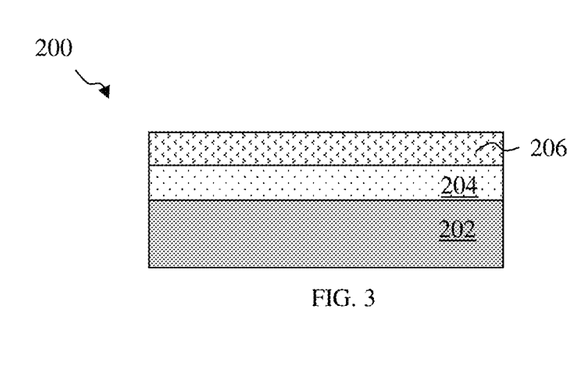

Referring to FIGS. 1 and 3, the method 100 forms a middle layer 206 (or a second layer) over the bottom layer 204 at operation 106. The middle layer 206 may be a single-layer structure or may include multiple layers each having a different composition. In many embodiments, the middle layer 206 has a composition that provides anti-reflective properties and/or hard mask properties for a subsequently implemented lithography process. In the depicted embodiment, referring to FIG. 9, the middle layer 206 includes a polymer chain 300 having a polymer backbone 320, such as a siloxane polymer backbone having a structure as depicted below, where "m" is any integer greater than 1. In some embodiments, the polymer backbone 320 has a molecular weight ranging from about 2,000 Dalton to about 1,000,000 Dalton. In an example embodiment, the polymer backbone 320 is configured to polymerize by one or more silanol condensation reactions.

In the depicted embodiment, the polymer chain 300 may include functional groups R and R', which may be the same or different and each may include an alkyl group (straight or cyclic) having 1 to 30 carbon atom(s), a hydroxyl group, a carboxylic acid group, an amine group, a norbornane, a benzene, an adamantine, a lactone group, a lactame group, and/or other suitable groups. Functional groups R and R' may each additionally include heteroatoms such as oxygen, nitrogen, and/or sulfur. In one such example, the addition of an alkyl group may be used to chemically tune the affinity between the middle layer 206 and a water-based solvent, a measure reflected in the hydrophilicity (or hydrophobicity) of the middle layer 206. Furthermore, a concentration of the alkyl group may be adjusted to achieve a desired hydrophilicity. Generally, a higher concentration of the alkyl group in the middle layer 206 may improve the hydrophobicity (i.e., more "oil-like") of the middle layer 206.

In the depicted embodiment, still referring to FIG. 9, the middle layer 206 includes a photosensitive moiety 304 as one or both of the R and R' groups bonded to the polymer backbone 320. The photosensitive moiety 304 may include one or more functional groups that undergo changes in chemical properties in the presence of an applied radiation source (e.g., an extreme ultraviolet, or EUV, KrF, ArF, etc.). Non-limiting examples of the photosensitive moiety 304 includes a photo-acid generator (PAG), a photo-base generator (PBG), photo-decomposable base (PDB), photo-decomposable quencher (PDQ), and/or other suitable moieties. In the example of a PAG, an acidic moiety (e.g., a proton $H^+$) is generated when the PAG is exposed to an applied radiation source (e.g., EUV). In the example of a PBG, a basic moiety (e.g., a hydroxyl group $OH^-$ or amine) is generated when the PBG is exposed to an applied radiation source that may or may not have the same wavelength as the radiation source applied for generating an acidic moiety in a PAG. In the depicted embodiment, a logarithmic acid dissociation constant (or "pKa") of the photosensitive moiety 304 ranges from about −10 to about 20.

Non-limiting examples of PAGs include salts of sulfonium cations with sulfonates, salts of iodonim cations with sulfonates, sulfonyldiazomethane compounds, N-sulfonyloxyimide PAGs, benzoinsulfonate PAGs, pyrogallol trisulfonate PAGs, nitrogenzyl sulfonate PAGs, sulfone PAGs, glyoxime derivatives, triphenylsulfonium nonaflate, and other suitable PAGs now known or later developed. In a depicted embodiment, the PAG may include an ionic compound (e.g., sulfonate-containing salts discussed above) having a cationic portion and an anionic portion.

Example structures of PBGs are illustrated below.

-continued

An example structure of a PDB is illustrated below.

Furthermore, non-limiting example structures of PDQs are illustrated below.

Figure 12A:
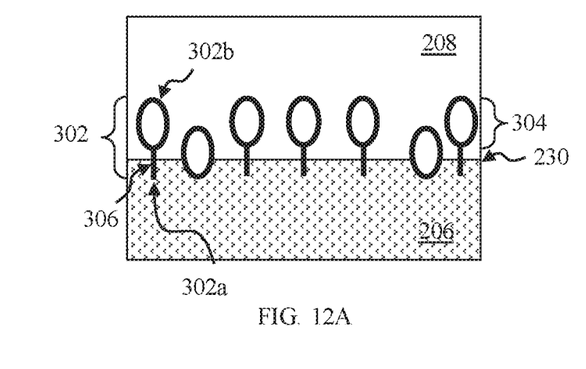
FIGS. 12A, 12B, 13A, and 13B illustrate portions of the example semiconductor device of FIGS. 2-8B according to various aspects of the present disclosure.

In some embodiments, referring to FIGS. 9 and 12A, the photosensitive moiety 304 is directly attached to the polymer backbone 320. In additional or alternative embodiments, the photosensitive moiety 304 is attached to the polymer backbone 320 via a linker group, e.g., linker group 306, such that the photosensitive moiety 304 and the linker group 306 form a molecular complex 302 having one end 302a anchored in the middle layer 206 as it is attached to the polymer backbone 320 and another end 302b extending into a bottom portion of a subsequently formed photoresist layer 208 over the middle layer 206. Notably, the linker group may be attached to either a cationic portion or an anionic portion of the photosensitive moiety 304, if the photosensitive moiety 304 carries either or both portions in its chemical structure.

To form the middle layer 206, a plurality of polymer chains 300 may be mixed and/or blended together to allow polymerization and/or cross-linking reactions to occur between the polymer chains 300. In some embodiments, the polymer chains are first dissolved in a solvent (e.g., PGEE (1-ethoxy-2-pranol), PGMEA (propylene glycol methyl ether acetate), water, and/or other suitable solvents) at a temperature of about 40 degrees Celsius to about 120 degrees Celsius to form a polymer solution before performing the polymerization and/or cross-linking reactions. Notably, if the temperature implemented for the mixing and/or blending of the polymer chains 300 is above about 120 degrees Celsius, polymerization and/or cross-linking reactions may occur prematurely and interfere with the formation of the middle layer 206 during the subsequent spin-coating process. Subsequently, the middle layer 206 may be formed by spin-coating the polymer solution over the bottom layer 204. A spin-coating process may use centrifugal force to disperse the polymer solution for forming the middle layer 206 across a surface of the underlying substrate (e.g., the bottom layer 204) to a uniform thickness. The middle layer 206 may then be baked at a temperature of about 100 degrees Celsius to about 300 degrees Celsius to allow cross-links to fully form between the polymer chains.

Figure 4:
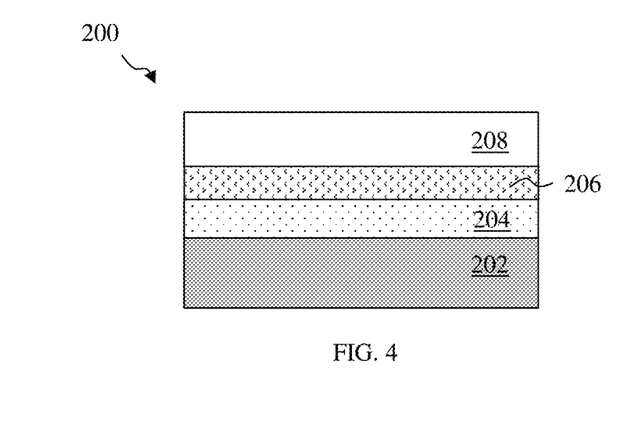
Figure 5:
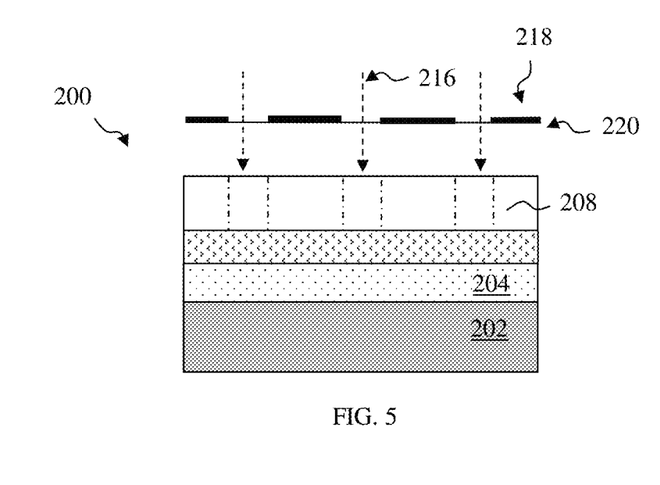

Referring to FIGS. 1 and 4, the method 100 forms a photoresist layer 208 over the middle layer 206. The photoresist layer 208 may be a photosensitive layer operable to be patterned by an exposure process, which initiates a series of photochemical reactions in the photoresist layer 208. The photoresist layer 208 may include any suitable photosensitive resist material, and in many embodiments, the photoresist layer 208 includes a resist material sensitive to a radiation source (e.g., UV light, deep ultraviolet (DUV) radiation, and/or EUV radiation). However, the principles of the present disclosure apply equally to e-beam resists and other direct-write resist materials. The photoresist layer 208 may have a single-layer structure or a multi-layer structure. In many embodiments, regions of the photoresist layer 208 exposed to the radiation source undergo chemical reactions such that they decompose and become soluble in a developing solution. In alternative embodiments, exposed regions of the photoresist layer 208 undergo chemical reactions such that they polymerize and/or crosslink and become insoluble in a developing solution.

In many embodiments, the photoresist layer 208 comprises a polymer having a backbone (not shown) with a plurality of functional groups (not shown) attached thereto. The polymer backbone may include an acrylate-based polymer, a poly(norbornene)-co-maleic anhydride (COMA) polymer, a poly(hydroxystyrene)-based polymer, other suitable polymers, or combinations thereof having any number of functional groups that may assist one or more subsequent exposure and developing processes. In one example, the functional groups may include lithographically sensitive groups (e.g., sensitizers) such as phenol, styrene, fluoride, and/or other suitable groups. In another example, the functional groups may include acid-labile groups (ALGs) configured to be cleavable from the polymer backbone by an acidic moiety.

Furthermore, the photoresist layer 208 may be implemented with a chemical amplification (CA) resist material by including photosensitive moieties in the resist material's composition. For example, the photoresist layer 208 includes one or more photo-acid generators (PAGs) that produce acidic moieties in response to radiation exposure. Non-limiting examples of suitable PAGs include salts of sulfonium cations with sulfonates, salts of iodonium cations with sulfonates, sulfonyldiazomethane compounds, N-sulfonyloxyimide PAGs, benzoinsulfonate PAGs, pyrogallol trisulfonate PAGs, nitrobenzyl sulfonate PAGs, sulfone PAGs, glyoxime derivatives, triphenylsulfonium nonaflate, and/or other suitable PAGs now known or later developed.

The photoresist layer 208 may additionally or alternatively include a photo-decomposable base (PDB) that, as the name suggests, decomposes basic moieties in response to the radiation source. In some embodiments, the PDBs have a different photo-sensitivity (e.g., responds to radiation of a different range of wavelengths) compared to the PAGs. The photoresist layer 208 may further include a photo-base generator (PBG) that produces basic moieties in response to the radiation source. The photoresist layer 208 may further include a photo-decomposable quencher (PDQ) configured to reduce concentration of acidic moieties in regions where chemical changes (e.g., changes in solubility) are not desired. In many embodiments, the photoresist layer 208 includes a photosensitive moiety (e.g., PAG, PBG, PDQ, or PDB) that is similar to the photosensitive moiety 304 included in the middle layer 206. The photoresist layer 208 may also include a number of additives such as cross-linking agents (e.g., tetramethylol glycoluril linker or epoxy linker), surfactant, chromophores, and/or solvents.

The photoresist layer 208 may be applied by any suitable technique. In an example embodiment, the photoresist layer 208 is applied in a liquid form using a spin-coating technique. To facilitate application, the photoresist layer 208 may include a solvent, which when removed, leaves the photoresist layer 208 in a solid or semisolid form (e.g., a film). The solvent may be one or more of the following: propylene glycol methyl ether acetate, propylene glycol monomethyl ether, gamma-butyrolactone, ethyl lactate, cyclohexanone, n-butyl actetate, ethyl ketone, dimethyl formamide, alcohol (e.g., isopropyl alcohol or ethanol), or other suitable solvent. The solvent may be driven off as part of the spin-coating process, during a settling process, and/or during a post-application/pre-exposure baking process. The pre-exposure basking process may be implemented by any suitable equipment such as a hotplate, at any temperature suitable for the particular compositions of the photoresist layer 208 and the solvent employed.

In many embodiments, forming the photoresist layer 208 over the middle layer 206 establishes an interface 230 (FIG. 12A) that includes portions of the photosensitive moiety 304 which is attached to a polymer backbone in the middle layer 206 as discussed above. For example, referring back to FIG. 12A, the molecular complex 302 has one end 302a anchored in the middle layer 206 and another end 302b extending into a bottom portion of the photoresist layer 208. As such, the molecular complex 302 comprising the photosensitive moiety 304 is disposed across the interface 230. In the depicted embodiments, a distance by which the end 302b extends into the bottom portion of the photoresist layer 208 depends on whether the photosensitive moiety 304 is attached to the polymer backbone 320 via a linker group, and if so, further on factors such as length, configuration, and/or chemical structure of each linker group. In many embodiments, presence of the photosensitive moieties 304 is not limited to be near and/or above the interface 230. For example, the photosensitive moieties 304 may be present throughout a thickness of the middle layer 206.

Figure 12B:
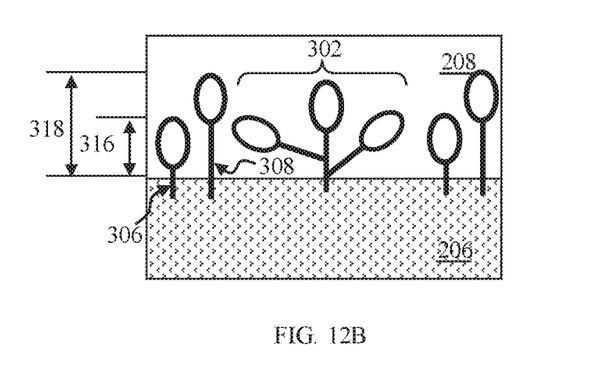

For example, referring to FIG. 12B, linker groups 306 and 308 have different molecular chain lengths such that the photosensitive moiety 304 attached to each linker group extends into the photoresist layer at a different distance, namely distance 316 and 318, respectively. In many embodiments, referring to FIGS. 10A and 10B, linker groups 306 and 308 have the same chemical structure (i.e., the monomer 322 and 323 are the same) but different numbers of units represented by integers "n1" and "n2," where n1≠n2 and both n1 and n2 are integers greater than or equal to 1. In the depicted embodiment, n2 is greater than n1, though embodiments of the present disclosure are not limited thereto. In other embodiments, linker groups 306 and 308 have different chemical structures (i.e., the monomers 322 and 323 are different) as well as different molecular chain lengths (i.e., n1≠n2). The monomer 322 and 323 may each include any one of the following structures, where "n" represents a number of monomer units and is an integer greater than or equal to 1.

Furthermore, referring to FIG. 10C, the linker group may also include a branched configuration such as that represented by linker group 310. In the depicted embodiment, the linker group 310 includes three segments connected at a moiety Y, where each segment includes at least one unit of the monomer 328, i.e., "m," "n," and "p" each representing an integer greater than or equal to 1. Accordingly, each linker group 310 is configured to be connectable to more than one photosensitive moiety 304. An example of the linker group 310 is depicted below, where each portion within the parentheses represents a chemical structure of the monomer 328.

Referring back to FIGS. 1 and 5, the method 100 exposes the photoresist layer 208 to a radiation source 216 at operation 110. In many embodiments, the radiation source 216 may be an I-line (wavelength approximately 365 nm), a DUV radiation such as KrF excimer laser (wavelength approximately 248 nm) or ArF excimer laser (wavelength approximately 193 nm), an EUV radiation (wavelength ranging from about 1 nm to about 100 nm), an x-ray, an e-beam, an ion beam, and/or other suitable radiations. The exposure process at operation 110 may be performed in air, in a liquid (immersion lithography), or in vacuum (e.g., for EUV lithography and e-beam lithography). In the depicted embodiment, the exposure process at operation 110 implements a photolithography technique using a photomask 220 that includes a pattern 218. The photomask 220 may be a transmissive mask or a reflective mask, each of which may further implement resolution enhancement techniques such as phase-shifting, off-axis illumination (OAI) and/or optical proximity correction (OPC). In alternative embodiments, the radiation source 216 is directly modulated with a predefined pattern, such as an IC layout, without using a photomask 220 (such as using an e-beam direct writer). In an example embodiment, the radiation source 216 is a EUV radiation and the exposure process at operation 110 is performed in a EUV lithography system. Correspondingly, a reflective photomask 220 may be used to pattern the photoresist layer 208.

Figure 6:
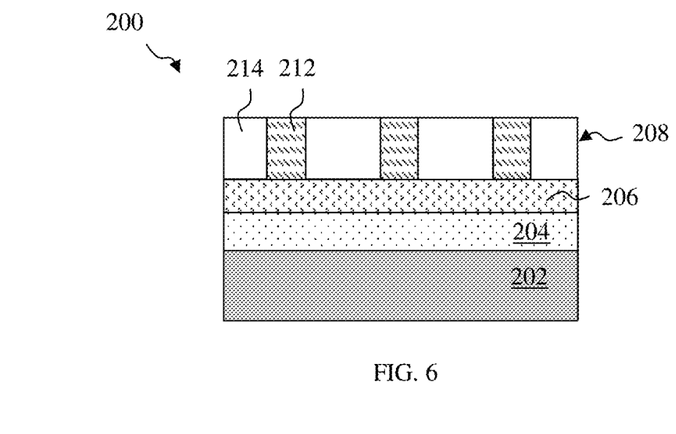

Subsequently, referring to FIG. 6, the material in the exposed regions 212 of the photoresist layer 208 has undergone photochemical reactions, while the material in the unexposed regions 214 of the photoresist layer 208 remains substantially the same as the resist material prior to being exposed. In some embodiments, the material in the exposed regions 212 decomposes and becomes soluble in a developing solution. In alternative embodiments, the material in the exposed regions 212 of the photoresist layer 208 polymerizes and/or cross-links and become insoluble in a developing solution. In the depicted embodiment, the resist material prior to being exposed is chemically amplified such that the chemical reactions brought about by the exposure process are initiated by one or more photosensitive moieties, which subsequently trigger further reactions in the material in the exposed regions.

Figure 13A:
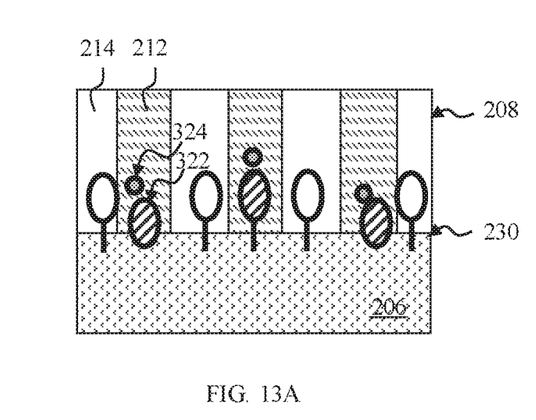
Figure 13B:
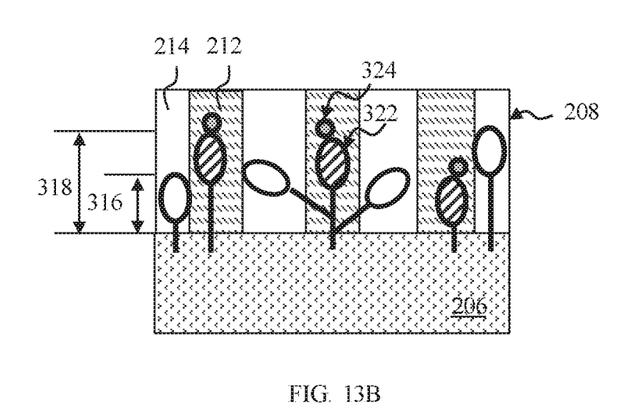

Referring to FIGS. 13A and 13B, exposing the photoresist layer 208 may also expose the photosensitive moiety 304 anchored to the middle layer 206. Here, FIG. 13A corresponds to an embodiment of FIG. 12A following the exposure process at operation 110, and FIG. 13B corresponds to an embodiment of FIG. 12B following a similar exposure process. Upon exposure to the radiation source 216, the photosensitive moieties 304 included in the exposed regions of the photoresist layer 208 undergo chemical reactions, while the photosensitive moieties 304 in the unexposed regions of the photoresist layer 208 remain substantially unchanged. In one such example, referring to FIG. 11, the photosensitive moiety 304 may undergo a photochemical reaction producing a first product 326 anchored to the polymer backbone 320 with or without a linker group and a second product 324 that is configured to freely diffuse into other portions of the photoresist layer 208. In many embodiments, the second product 324 may be an acidic moiety (e.g., $H^+$ ion) or a basic moiety (e.g., $OH^-$ ion), depending upon the chemical structure of the photosensitive moiety 304 from which it derives. If the photosensitive moiety 304 is bonded to the polymer backbone 320 via a shorter linker group (or no linker group at all), the second product 324 may remain closer to the interface 230 than if the photosensitive moiety 304 is bonded to the polymer backbone 320 via a longer linker group.

In addition or alternative to the length of the linker group (e.g., linker groups 306, 308, or 310), factors such as connection site between the photosensitive moiety 304 and the linker group (e.g., at a cationic portion or an anionic portion of the photosensitive moiety 304), molecular rigidity of the linker group, molecular weight of the linker group, and/or polarity of the photosensitive moiety 304 may contribute to determining the diffusion distance of the second product 324. In one such example where the photosensitive moiety 304 is a PAG, if the linker group 306 is bonded to the photosensitive moiety 304's cationic portion, the diffusion length of the second product 324 (e.g., an acidic moiety) produced by the PAG upon exposure may be controlled by adjusting the molecular weight and/or the polar functionality of the anionic portion. A higher molecular weight and/or the polarity of the anionic portion may reduce the diffusion length of the second produce 324. On the other hand, if the linker group 306 is bonded to the photosensitive moiety 304's anionic portion, the diffusion length of the second produce 324 may be controlled by adjusting the length and the rigidity of the linker group 306.

Figure 7:
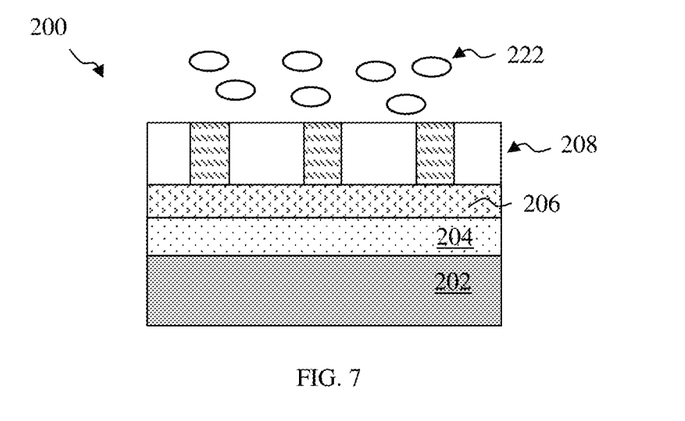
Figure 8A:
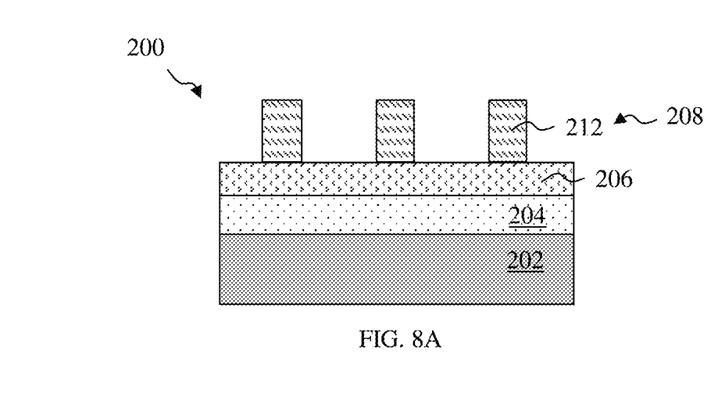
Figure 8B:
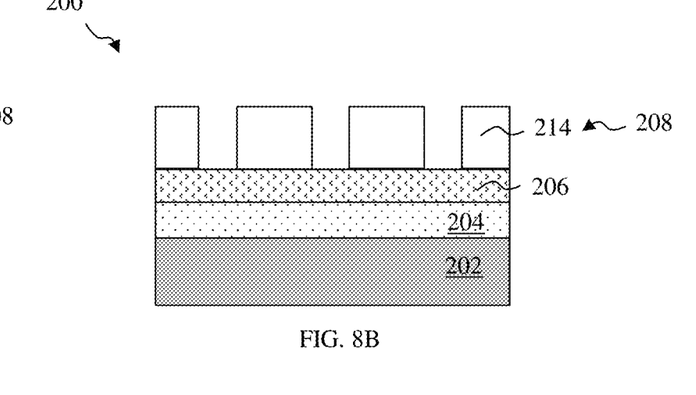

Referring to FIGS. 1 and 7, the method 100 implements a developing process on the workpiece 200 at operation 112. The developing process dissolves or otherwise removes either the material in the exposed regions 212 (referring to FIG. 8B) or the material in the unexposed regions 214 (referring to FIG. 8A) depending upon the specific chemical changes occurred during the exposure process at operation 110 and the nature of the developer used. The developing process at operation 112 may begin with a post-exposure baking process. Depending on the polymer(s) included in the photoresist layer 208, the post-exposure baking process may catalyze a reaction between the reacted photosensitive moieties and the polymer in the photoresist layer 208. For example, the post-exposure baking process may accelerate the decomposing of the polymer in the exposed regions. Following the optional post-exposure baking process, a developer 222 is applied to the workpiece 200, thereby removing the particular regions (exposed or unexposed) of the photoresist layer 208. Suitable water-based developers include tetramethyl ammonium hydroxide (TMAH), KOH, NaOH, and/or other suitable solvents, and suitable organic solvent-based developers include solvents such as n-butyl acetate, ethanol, hexane, benzene, toluene, and/or other suitable solvents. Applying the developer 222 may include spraying the developer 222 on the photoresist layer 208 by a spin-coating process. In many embodiments, a post-exposure bake is performed on the workpiece 200 subsequent to the developing process at operation 112 to further stabilize the pattern formed in the photoresist layer 208.

As discussed above, photosensitive moieties in the photoresist layer 208 may include one or more of the following: PAG, PBG, PDB, PDQ, or other suitable moieties. Using PAG as an example, upon exposure, PAG in the photoresist layer 208 absorbs radiation and produces an acidic moiety (e.g., $H^+$) in a chemical reaction, which then cleaves a protecting group (e.g., ALG) bonded to the polymer backbone of the resist material and causes the polymer backbone to decompose. When an appropriate developer is subsequently applied, exposed regions 212 (or alternatively, unexposed regions 214) of the resist material may be removed (e.g., by dissolution) to yield a desired pattern in the photoresist layer 208. Accordingly, the quality of the pattern thus formed depends on, among other factors, the extent of exposure experienced by the PAG in the photoresist layer 208.

Referring back to FIGS. 12A-13B, the present disclosure provides embodiments in which additional photosensitive moieties (i.e., the photosensitive moieties 304) may be included in the underlying middle layer 206 having one end 302a anchored in the middle layer 206 and another end 302b extended into the photoresist layer 208 at a desirable distance (e.g., distance 316 or distance 318) to ensure that the exposure and dissolution occur to a similar extent throughout the thickness of the photoresist layer 208. In one example, if footing is likely to occur due to insufficient acid production at the bottom portion of the photoresist layer 208, the photosensitive moieties 304 may include additional PAGs. Conversely, if undercut is likely to occur due to excessive acid production at the bottom portion of the photoresist layer 208, the photosensitive moieties 304 may include additional PBGs. Furthermore, extent of acid (or base) production provided by the photosensitive moieties 304 may be fine-tuned by selecting linker groups (e.g., linker groups 306, 308, or 310) having various lengths, chemical structures, and/or configurations as discussed herein. For example, if footing is likely to occur, additional PAGs may be anchored closer to the middle layer 206 (e.g., at a shorter distance 316 away from the interface 230) with the use of a shorter linker group (e.g., linker group 308) or no linker group at all. In another example, if insufficient acid production may be experienced in a middle portion of the photoresist layer 208, PAGs may be anchored farther away from the middle layer 206 (e.g., at a longer distance 318 away from the interface 230) with the use of a longer linker group (e.g., linker group 308).

Referring to FIG. 1, the method 100 performs additional fabrication processes at operation 114 that include, for example, transferring the pattern formed in the photoresist layer 208 to the underlying middling layer 206 and the bottom layer 204 in one or more etching processes. The etching processes may be implemented by any suitable method including a dry etching process, a wet etching process, other suitable etching process, a reactive ion etching (RIE) process, or combinations thereof. Subsequently, the substrate 202 may be processed using the patterned bottom layer 204 as a mask. Any suitable method may be performed to process the substrate 202 including a deposition process, an implantation process, an epitaxial growth process, and/or any other fabrication process. In an example embodiment, the substrate 202 is etched using the patterned bottom layer 204 as an etch mask. However, embodiments of the present disclosure apply to any fabrication process performed on the substrate 202. In various examples, patterned bottom layer 204 is used as a mask to fabricate a gate stack, to fabricate an interconnect structure, to form non-planar devices by etching to expose a fin or by epitaxially growing fin material, and/or other suitable applications in the substrate 202. After the substrate 202 has been processed using the patterned photoresist layer 208, the patterned middle layer 206, and/or the patterned bottom layer 204, the layers 208, 206, and 204 are removed from the substrate 202.

In many embodiments, following the operation 114, the workpiece 200 may be used to fabricate an integrated circuit chip, a system-on-a-chip (SOC), and/or a portion thereof, and thus the subsequent fabrication processes may form various passive and active microelectronic devices such as resistors, capacitors, inductors, diodes, metal-oxide semiconductor field effect transistors (MOSFET), complementary metal-oxide semiconductor (CMOS) transistors, bipolar junction transistors (BJT), laterally diffused MOS (LDMOS) transistors, high power MOS transistors, other types of transistors, and/or other circuit elements.

Various advantages may be present in one or more embodiments of the methods, devices, and compositions described herein. The present disclosure provides a lithographic tri-layer structure that includes a chemically modified middle layer material. Specifically, the middle layer material may include a siloxane polymer backbone having photosensitive moieties such as PAGs, PBGs, PDBs, and PDQs bonded thereto. The present disclosure provides many embodiments in which the photosensitive moieties are bonded to the polymer backbone optionally via one or more linker groups having various lengths, configurations, and chemical structures. Accordingly, the photosensitive moieties may extend across an interface between the middle layer and a subsequently formed photoresist layer such that one end of each photosensitive moiety is anchored in the middle layer, while the other end extends into a bottom portion of the photoresist layer at a desired distance. As the photosensitive moieties are exposed to a radiation source, reaction products (e.g., acidic or basic moieties) configured to alter the chemical properties of the resist material are released into the photoresist layer. As such, embodiments of the present disclosure ensure that exposure and subsequent development processes occur to a similar extent throughout the thickness of the photoresist layer, which in turn may remedy pattern irregularities such as footing and undercut.

In one aspect, the present disclosure provides a method that includes providing a substrate, forming a bottom layer over the substrate, forming a middle layer over the bottom layer, forming a photoresist layer over the middle layer, exposing the photoresist layer to a radiation source, and developing the photoresist layer to form a pattern. In some embodiments, a top surface of the middle layer includes a photosensitive moiety having a first end anchored in the middle layer and a second end extending away from the top surface of the middle layer.

In some embodiments, the photosensitive moiety includes one of a photo-acid generator, a photo-base generator, a photo-decomposable quencher, or a photo-decomposable base. In further embodiments, the middle layer includes a silicon-based polymer having the first end of the photosensitive moiety bonded to the silicon-based polymer. In further embodiments, the photosensitive moiety is bonded to the silicon-based polymer via a linker group. In still further embodiments, the linker group is configured to be bondable to a plurality of photosensitive moieties.

In some embodiments where the photosensitive moiety is a first photosensitive moiety and the linker group is a first linker group, the middle layer further includes a second photosensitive moiety bonded to the silicon-based polymer via a second linker group, such that the first linker group and the second linker group have different lengths that extend away from the top surface of the middle layer. In further embodiments, the first photosensitive moiety and the second photosensitive moiety have different chemical structures. In still further embodiments, the first linker group includes a plurality of a first monomer and the second linker group includes a plurality of a second monomer, the first monomer and the second monomer having different chemical structures.

In another aspect, the present disclosure provides a method that includes forming a bottom layer over a substrate, forming a middle layer over the bottom layer, forming a photoresist layer over the middle layer, and exposing the photoresist layer to a radiation source. In some embodiments, a top surface of the middle layer includes a polymer backbone having a first photosensitive moiety attached thereto. In some embodiments, the photoresist layer includes a second photosensitive moiety, and a portion of the first photosensitive moiety extends into a bottom portion of the photoresist layer.

In some embodiments, the polymer backbone includes a siloxane-based polymer, and the polymer backbone further includes one of an alkyl group having 1 to 10 carbon atom(s), a hydroxyl group, a carboxylic acid group, an amine group, a norbornane group, a benzene group, or an adamantine group.

In some embodiments, the first photosensitive moiety is attached to the polymer backbone via a straight or a branched linker group.

In some embodiments, the exposing causes the first photosensitive moiety and the second photosensitive moiety to both produce acidic moieties. In some embodiments, the exposing causes the first photosensitive moiety to produce a basic moiety and the second photosensitive moiety to produce an acidic moiety.

In yet another aspect, the present disclosure provides a method that includes forming a bottom layer over a substrate, forming a middle layer over the bottom layer, forming a photoresist layer over the middle layer, and exposing the photoresist layer to a radiation source. In some embodiments, a top surface of the middle layer includes a first photosensitive moiety and a second photosensitive moiety.

In some embodiments, the first photosensitive moiety extends into the photoresist layer at a first distance and the second photosensitive moiety extends into the photoresist layer at a second distance, the first distance being different from the second distance.

In some embodiments, the first photosensitive moiety and the second photosensitive moiety each includes a photo-acid generator, a photo-base generator, a photo-decomposable quencher, or a photo-decomposable base. In further embodiments, the first photosensitive moiety and the second photosensitive moiety have different chemical structures.

In some embodiments, the forming of the middle layer includes forming a silicon-based polymer, where the first photosensitive moiety and the second photosensitive moiety are attached to the silicon-based polymer. In further embodiments, the first photosensitive moiety is attached to the silicon-based polymer via a first linker group and the second photosensitive moiety is attached to the silicon-based polymer via a second linker group. In still further embodiments, the first linker group has a length equal to the first distance and the second linker group has a length equal to the second distance.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method comprising:
providing a substrate;
forming a bottom layer over the substrate;
forming a middle layer over the bottom layer, wherein the middle layer includes a polymer backbone and a branched linker group connected to the polymer backbone, wherein the branched linker group includes at least two branches including the same repeating unit but of different lengths, and wherein the middle layer further includes a photosensitive moiety bonded to at least one of the branches;
forming a photoresist layer over the middle layer, such that the photosensitive moiety spans across an interface between the middle layer and the photoresist layer;
exposing the photoresist layer to a radiation source; and
developing the photoresist layer to form a pattern.

2. The method of claim 1, wherein the photosensitive moiety includes one of a photo-acid generator, a photo-base generator, a photo-decomposable quencher, or a photo-decomposable base.

3. The method of claim 1, wherein the branched linker group is configured to be bondable to a plurality of photosensitive moieties.

4. The method of claim 1, wherein the photosensitive moiety is a first photosensitive moiety bonded to a first branch of the branched linker group, wherein the middle layer further comprising a second photosensitive moiety bonded to a second branch of the branched linker group spanning across the interface, and wherein the different lengths between the first and the second branches are defined by different numbers of the same repeating units.

5. The method of claim 4, wherein the first photosensitive moiety and the second photosensitive moiety have different chemical structures.

6. The method of claim 5, wherein the first photosensitive moiety is a photo-decomposable base and the second photosensitive moiety is a photo-decomposable quencher.

7. The method of claim 4, wherein the middle layer further comprising a third photosensitive moiety bonded to a third branch of the branched linker group spanning across the interface, wherein the third photosensitive moiety is of a different type from the first and the second photosensitive moieties, and wherein the different lengths between the first, the second, and the third branches are defined by different numbers of the same repeating unit.

8. The method of claim 7, wherein the first photosensitive moiety is a photo-decomposable base, the second photosensitive moiety is a photo-base generator, and the third photosensitive moiety is a photo-decomposable quencher.

9. The method of claim 1, wherein the branches are physically separated from each other.

10. A method comprising:
forming a bottom layer over a substrate;
forming a middle layer over the bottom layer, wherein a top surface of the middle layer includes a polymer backbone having a branched linker group attached thereto, wherein the branched linker group includes at least two branches formed of different numbers of a monomer, and wherein the middle layer further includes at least a first photosensitive moiety and a second photosensitive moiety of different types bonded to the at least two branches;
forming a photoresist layer over the middle layer, wherein the photoresist layer includes a third photosensitive moiety that is of the same type as one of the first and the second photosensitive moieties, wherein a top portion of each of the first and the second photosensitive moieties penetrates a bottom portion of the photoresist layer, and wherein a bottom portion of each of the first and the second photosensitive moieties remains in the middle layer; and
exposing the photoresist layer to a radiation source.

11. The method of claim 10, wherein the polymer backbone includes a siloxane-based polymer.

12. The method of claim 11, wherein the polymer backbone further includes one of an alkyl group having 1 to 10 carbon atom(s), a hydroxyl group, a carboxylic acid group, an amine group, a norbornane group, a benzene group, or an adamantine group.

13. The method of claim 10, wherein the different types of photosensitive moieties include a photo-acid generator, a photo-base generator, a photo-decomposable quencher, and a photo-decomposable base.

14. The method of claim 13, wherein the branched linker group includes three branches, and wherein the middle layer includes the photo-base generator, the photo-decomposable quencher, and the photo-decomposable base bonded to the three branches of the branched linker group.

15. The method of claim 10, wherein a number of the monomer in each of the at least two branches defines a distance of the first and the second photosensitive moiety that penetrates into the bottom portion of the photoresist layer, respectively.

16. A method comprising:
forming a bottom layer over a substrate;
selecting a first photosensitive moiety and a second photosensitive moiety of a different type from the first photosensitive moiety;

forming a middle layer over the bottom layer, wherein the middle layer includes a polymer backbone, a first photosensitive moiety connected to the polymer backbone via a first linker group, and a second photosensitive moiety connected to the polymer backbone via a second linker group, wherein the first linker group is formed with a first number of a repeating unit and the second linker group is formed with a second number of the same repeating unit, and wherein the second number is different from the first number;

forming a photoresist layer over the middle layer, wherein the first photosensitive moiety extends into the photoresist layer at a first distance defined by the first number, and the second photosensitive moiety extends into the photoresist layer at a second distance defined by the second number; and exposing the photoresist layer to a radiation source, wherein the first photosensitive moiety and the second photosensitive moiety are selected such that a difference between the first distance and the second distance ensures uniform exposing throughout a thickness of the photoresist layer.

17. The method of claim 16, wherein the first photosensitive moiety includes a photo-acid generator and the second photosensitive moiety includes a photo-base generator, a photo-decomposable quencher, or a photo-decomposable base.

18. The method of claim 17, wherein the second photosensitive moiety includes a photo-decomposable base.

19. The method of claim 16, wherein the first photosensitive moiety includes a photo-decomposable quencher and the second photosensitive moiety includes a photo-decomposable base.

20. The method of claim 16, wherein the first linker group has a branched structure including at least two branches formed of different numbers of the repeating unit.

* * * * *